(12) United States Patent
Zhao et al.

(10) Patent No.: US 11,408,777 B2
(45) Date of Patent: Aug. 9, 2022

(54) TEMPERATURE SENSOR, DISPLAY PANEL, AND DISPLAY APPARATUS

(71) Applicant: BOE Technology Group Co., Ltd., Beijing (CN)

(72) Inventors: Lijun Zhao, Beijing (CN); Yingming Liu, Beijing (CN); Haisheng Wang, Beijing (CN); ChihJen Cheng, Beijing (CN); Pengpeng Wang, Beijing (CN); Chunwei Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 828 days.

(21) Appl. No.: 16/330,312

(22) PCT Filed: Jun. 12, 2018

(86) PCT No.: PCT/CN2018/090875
§ 371 (c)(1),
(2) Date: Mar. 4, 2019

(87) PCT Pub. No.: WO2018/228389
PCT Pub. Date: Dec. 20, 2018

(65) Prior Publication Data
US 2019/0226920 A1    Jul. 25, 2019

(30) Foreign Application Priority Data

Jun. 13, 2017  (CN) .......................... 201710443333.5

(51) Int. Cl.
*H01L 27/12* (2006.01)
*G01K 7/01* (2006.01)
(Continued)

(52) U.S. Cl.
CPC ............... *G01K 7/015* (2013.01); *G01K 7/01* (2013.01); *G09F 9/00* (2013.01); *H01L 23/34* (2013.01);
(Continued)

(58) Field of Classification Search
CPC . G01K 7/015; G01K 7/01; G01K 7/32; G09F 9/00; H01L 23/34; H01L 27/1214;
(Continued)

(56) References Cited

U.S. PATENT DOCUMENTS 4,924,212 A    5/1990  Fruhauf et al.
10,198,990 B2  2/2019  Tong
(Continued)

FOREIGN PATENT DOCUMENTS

CN    1731113 A      2/2006
CN    101915625 A   12/2010
(Continued)

OTHER PUBLICATIONS

Second office action of Chinese application No. 201710443333.5 dated Apr. 9, 2019.
(Continued)

*Primary Examiner* — Mohammed R Alam
(74) *Attorney, Agent, or Firm* — Fay Sharpe LLP

(57) ABSTRACT

The present disclosure discloses a temperature sensor, a display panel, and a display apparatus, in the field of sensors. The temperature sensor includes a ring oscillator consisting of n levels of phase inverters, where n is an odd number greater than or equal to 1. Each level of phase inverter includes a first thin film transistor (TFT) and a second TFT that are connected in series. An on/off state of the second TFT is configured to be in a normally-on state, an on/off state of the first TFT is configured to be determined by a signal input to the phase inverter, and mobility of an active
(Continued)

layer material of the first TFT is greater than mobility of an active layer material of the second TFT.

20 Claims, 5 Drawing Sheets

(51) Int. Cl.
  *H01L 23/34* (2006.01)
  *H01L 29/786* (2006.01)
  *G09F 9/00* (2006.01)
(52) U.S. Cl.
  CPC ...... *H01L 27/1214* (2013.01); *H01L 27/1225* (2013.01); *H01L 27/1251* (2013.01); *H01L 29/7869* (2013.01); *H01L 29/78645* (2013.01); *H01L 29/78648* (2013.01); *H01L 29/78663* (2013.01); *H01L 29/78672* (2013.01)
(58) Field of Classification Search
  CPC ............. H01L 27/1225; H01L 27/1251; H01L 29/78645; H01L 29/78648; H01L 29/78663; H01L 29/78672; H01L 29/7869
  See application file for complete search history.

(56) References Cited

U.S. PATENT DOCUMENTS

| | | |
|---|---|---|
| 2011/0102091 A1 | 5/2011 | Yeric |
| 2011/0242069 A1 | 10/2011 | Yamamoto et al. |
| 2016/0351109 A1 | 12/2016 | Han et al. |
| 2017/0074722 A1 | 3/2017 | Zhang et al. |
| 2017/0214399 A1* | 7/2017 | Zogopoulos ............. H03K 5/24 |
| 2017/0229517 A1* | 8/2017 | Xu ........................ H01L 27/283 |
| 2018/0293937 A1* | 10/2018 | Tong .................... G09G 3/3225 |
| 2019/0360869 A1* | 11/2019 | Cao .......................... G01K 7/00 |

FOREIGN PATENT DOCUMENTS

| | | |
|---|---|---|
| CN | 102072781 A | 5/2011 |
| CN | 102214436 A | 10/2011 |
| CN | 104596659 A | 5/2015 |
| CN | 104809979 A | 7/2015 |
| CN | 104897280 A | 9/2015 |
| CN | 105390508 A | 3/2016 |
| CN | 106023890 A | 10/2016 |
| CN | 106768437 A | 5/2017 |
| JP | 2000009547 A | 1/2000 |

OTHER PUBLICATIONS

International Search Report (including English translation) and Written Opinion of PCT/CN2018/090875, dated Sep. 6, 2018.
Donald A. Neamen etal, Microelectronics Circuit Analysis and Design (Third Edition), pp. 951-953 and 964-965, Tsinghua University Press, Jan. 31, 2009.
The First Office Action of the priority Chinese application No. 201710443333.5 dated Nov. 1, 2018.

* cited by examiner ically high or low temperature may probably cause damage to the display panel to affect display quality. To prevent excessively high or low temperature from damaging the display panel, a temperature sensor may usually be disposed to monitor temperature of the display panel, so that measures can be adopted when it is detected that the temperature of the display panel is relatively high or low, thereby avoiding damage to the display panel.

TEMPERATURE SENSOR, DISPLAY PANEL, AND DISPLAY APPARATUS

This application is a 371 of PCT Patent Application Serial No. PCT/CN2018/090875, filed on Jun. 12, 2018, which claims priority to Chinese Patent Application No. 201710443333.5, filed on Jun. 13, 2017 and entitled "TEMPERATURE SENSOR, DISPLAY PANEL, AND DISPLAY APPARATUS", which is incorporated herein by reference in its entirety.

TECHNICAL FIELD

The present disclosure relates to the field of sensors, and in particular, to a temperature sensor, a display panel, and a display apparatus.

BACKGROUND

With the rapid development of display technologies, display apparatuses are increasingly widely used. A display apparatus usually includes a display panel. During actual application, excessively high or low temperature may probably cause damage to the display panel to affect display quality. To prevent excessively high or low temperature from damaging the display panel, a temperature sensor may usually be disposed to monitor temperature of the display panel, so that measures can be adopted when it is detected that the temperature of the display panel is relatively high or low, thereby avoiding damage to the display panel.

SUMMARY

The present disclosure provides a temperature sensor, a display panel, and a display apparatus. The technical solutions are as follows.

In a first aspect, there is provided a temperature sensor, comprising a ring oscillator consisting of n levels of phase inverters, wherein n is an odd number, wherein each level of phase inverter comprises a first thin film transistor (TFT) and a second TFT that are connected in series, an on/off state of the first TFT is configured to be determined by a signal input to the phase inverter, an on/off state of the second TFT is configured to be in a normally on state, and mobility of an active layer material of the first TFT is greater than mobility of an active layer material of the second TFT.

Optionally, a combination of a type of the first TFT and a type of the second TFT is any of the followings: the first TFT is a low temperature poly-silicon TFT, and the second TFT is an amorphous silicon TFT; the first TFT is an oxide semiconductor TFT, and the second TFT is an amorphous silicon TFT; and the first TFT is a low temperature poly-silicon TFT, and the second TFT is an oxide semiconductor TFT.

Optionally, a gate of the first TFT is connected to an input terminal of the phase inverter, a first electrode of the first TFT is connected to a first electrode of the second TFT and an output terminal of the inverter respectively, and a second electrode of the first TFT is connected to a signal port configured to output a first level signal; a gate of the second TFT and a second electrode of the second TFT are connected to a signal port configured to output a target level signal respectively, wherein the target level signal is a level signal that can turn on the second TFT, each of a level of the target level signal and a level of the first level signal is one of a first level and a second level, respectively, and the first level is a high level relative to the second level; and each of the first electrode and the second electrode are one of a source and a drain, respectively.

Optionally, the first TFT and the second TFT are both n-type TFTs.

Optionally, the first TFT is an n-type TFT, and the second TFT is a p-type TFT.

Optionally, the first TFT has a bottom gate structure, a top gate structure and a double gate structure; and the second TFT has a bottom gate structure, a top gate structure and a double gate structure.

Optionally, a gain value of the ring oscillator is greater than 1, and the gain value is:

$$A_V = \sqrt{\frac{\mu_1 C_{ox1}\left(\frac{W_1}{L_1}\right)}{\mu_2 C_{ox2}\left(\frac{W_2}{L_2}\right)}},$$

wherein $A_v$ is a gain between the first TFT and the second TFT, $\mu_1$ is the mobility of the active layer material of the first TFT, $C_{ox1}$ is a capacitance of a gate insulating layer of the first TFT, $$\frac{W_1}{L_1}$$

is a width/length ratio of a channel of the first TFT, $\mu_2$ is the mobility of the active layer material of the second TFT, $C_{ox2}$ is a capacitance of a gate insulating layer of the second TFT, and $$\frac{W_2}{L_2}$$

is a width/length ratio of a channel of the second TFT.

Optionally, the temperature sensor further comprises a frequency detection circuit connected to the ring oscillator; and the frequency detection circuit is configured to detect frequency of an oscillating wave generated by the ring oscillator.

Optionally, a gate of the first TFT is connected to an input terminal of the inverter, a first electrode of the first TFT is connected to a first electrode of the second TFT and an output terminal of the inverter respectively, and a second electrode of the first TFT is connected to a signal port configured to output a first level signal; a first electrode of the second TFT is further connected to the output terminal of the inverter, and a gate of the second TFT and a second electrode of the second TFT are connected to a signal port configured to output a target level signal respectively; the target level signal is a level signal that can turn on the second TFT, each of a level of the target level signal and a level of the first level signal is one of a first level and a second level, respectively, and the first level is a high level relative to the second level; and each of the first electrode and the second electrode are one of a source and a drain, respectively; a combination of a type of the first TFT and a type of the second TFT is any of the followings: the first TFT is a low temperature poly-silicon TFT, and the second TFT is an amorphous silicon TFT; the first TFT is an oxide semiconductor TFT, and the second TFT is an amorphous silicon TFT; the first TFT is a low temperature poly-silicon TFT, and the second TFT is an oxide semiconductor TFT; the first TFT has one of a bottom gate structure, a top gate structure and a double gate structure; and the second TFT has one of a bottom gate structure, a top gate structure and a double gate structure; and a combination of the first TFT and the second TFT is any of the following: the first TFT and the second TFT are both n-type TFTs; and the first TFT is an n-type TFT, and the second TFT is a p-type TFT.

In a second aspect, there is provided a display panel, wherein any of the temperature sensors described above is disposed in the display panel.

Optionally, the display panel comprises a substrate and a plurality of thin film transistors (TFT) disposed on the substrate, and the plurality of TFTs comprises the first TFT and the second TFT.

Optionally, the first TFT and the second TFT are disposed adjacently on the substrate.

Optionally, the n levels of phase inverters are disposed adjacently on the substrate.

Optionally, the first TFT and the second TFT are disposed in a non-display region of the display panel.

In a third aspect, there is provided a display apparatus, wherein the display apparatus comprises any of the display panels described in the second aspect.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show only some embodiments of the present disclosure, and a person of ordinary skill in the art may still derive other drawings from these accompanying drawings without creative efforts.

DETAILED DESCRIPTION

To make the objectives, technical solutions, and advantages in the present disclosure clearer, the following further describes the implementation manners of the present disclosure in detail with reference to the accompanying drawings.

Generally, to protect a display panel and ensure display quality of the display panel, a temperature sensor configured to measure temperature of the display panel may be disposed in a display apparatus. When the temperature sensor measures that the temperature of the display panel is excessively high or low, the display apparatus may respond in time to adjust the temperature of the display panel.

In related technology, a temperature sensor is usually disposed outside the display panel and connected to the display panel. However, when the temperature sensor is disposed outside the display panel, the temperature sensor cannot accurately monitor temperature inside the display panel, resulting in relatively low measurement accuracy of the temperature sensor.

Embodiments of the present disclosure provide a temperature sensor configured to measure temperature of a display panel. The temperature sensor consists of a TFT. The display panel may usually include a plurality of TFTs. Therefore, the temperature sensor provided in the embodiments of the present disclosure may be integrated in the display panel, so that the temperature sensor can measure the temperature of the display panel more accurately.

Figure 1:
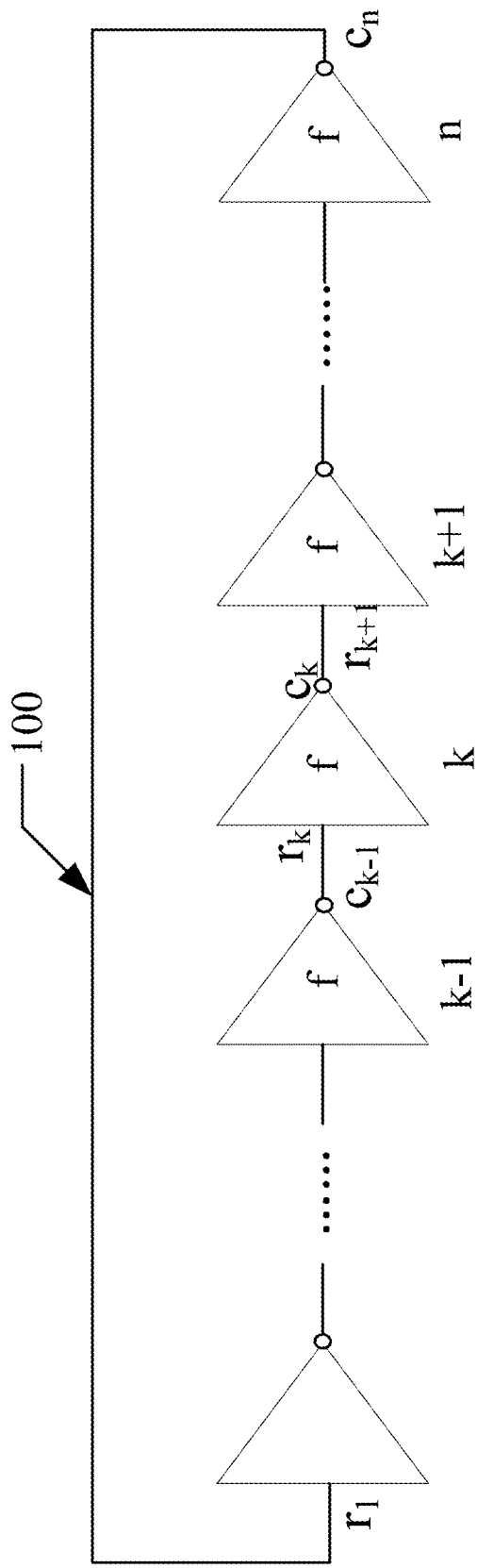
FIG. 1 is a schematic structural diagram of a temperature sensor according to an embodiment of the present disclosure.

FIG. 1 is a schematic diagram of a temperature sensor according to an embodiment of the present disclosure. As shown in FIG. 1, the temperature sensor includes a ring oscillator 100 consisting of n levels of phase inverters f, where n is an odd number greater than or equal to 1. Each level of phase inverter f includes a first thin film transistor (TFT) and a second TFT that are connected in series. An on/off state of the second TFT is configured to be in a normally-on state, an on/off state of the first TFT is configured to be determined by a signal input to the phase inverter, and mobility of an active layer material of the first TFT is greater than mobility of an active layer material of the second TFT.

It should be noted that the foregoing "connected in series" means that a source or a drain of the first TFT is connected to a source of the second TFT, or, a source or a drain of the first TFT is connected to a drain of the second TFT, so that when the first TFT and the second TFT are both turned on, a current may pass through the sources and drains of the first TFT and the second TFT without generating a branch current.

A phase inverter is an electronic device that can shift a phase of an input signal by 180 degrees for output. To be specific, a signal input to an input terminal and a signal output from an output terminal of the phase inverter have a phase difference of 180 degrees. For example, when the signal input to the input terminal of the phase inverter is a high level signal, the signal output from the output terminal is a low level signal, and when the signal input to the input terminal of the phase inverter is a low level signal, the signal output from the output terminal is a high level signal.

Figure 2:
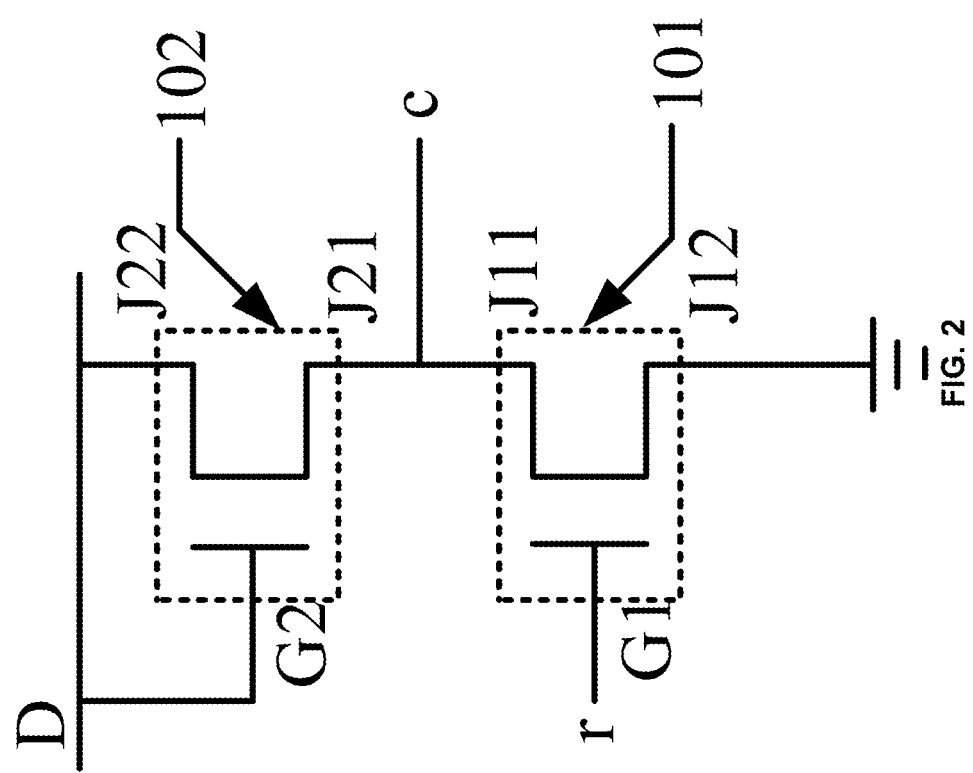
FIG. 2 is a schematic structural diagram of a phase inverter according to an embodiment of the present disclosure.

The phase inverter fin this embodiment of the present disclosure consists of a first TFT and a second TFT that are connected in series. Referring to FIG. 2, FIG. 2 is a schematic structural diagram of a phase inverter according to an embodiment of the present disclosure. A gate G1 of the first TFT 101 is connected to an input terminal r of the phase inverter. A first electrode J11 of the first TFT 101 is connected to a first electrode J21 of the second TFT 102 and an output terminal c of the inverter, respectively. A second electrode of the first TFT 101 is connected to a signal port configured to output a first level signal. A gate G1 of the first TFT 101 is connected to an input terminal r of the inverter. A first electrode J21 of the second TFT 102 is further connected to the output terminal c of the inverter. A gate G2 of the second TFT 102 and a second electrode J22 of the second TFT 102 are connected to a signal port D configured to output a target level signal. The target level signal is a level signal that can turn on the second TFT 102. Each of a level of the target level signal and a level of the first level signal is one of a first level and a second level, respectively. That is, the level of the first level signal is a low level when the level of the target level signal is a high level, and the level of the first level signal is a high level when the level of the target level signal is a low level.

It should be noted that the first electrode J11 of the first TFT 101 may be a source of the first TFT 101, and a second electrode J12 may be a drain of the first TFT 101, or, the first electrode J11 of the first TFT may be a drain of the first TFT 101, and a second electrode J12 may be a source of the first TFT 101. Similarly, the first electrode J21 of the second TFT 102 may be a source of the second TFT 102, and the second electrode J22 may be a drain of the second TFT 102, or, the first electrode J21 of the second TFT may be a drain of the second TFT 102, and the second electrode J22 may be a source of the second TFT 101. This is not specifically limited in this embodiment of the present disclosure.

As shown in FIG. 2, the gate G2 of the second TFT 102 is connected to the signal port D configured to output a target level signal. Therefore, the second TFT 102 is in a normally-on state, and the gate G1 of the first TFT 101 is connected to the input terminal r of the phase inverter. Therefore, the on/off state of the first TFT 101 is determined by a signal input to the phase inverter.

During actual application, the first TFT 101 and the second TFT 102 may be both n-type TFTs. To be specific, the first TFT 101 and the second TFT 102 are both turned on by a high level signal and are cut off by a low level signal. In this case, the target level signal may be a high level signal, and the first level signal is a low level signal. That is, the level of the target level signal is a high level relative to the level of the first level signal. Exemplarily, the signal port configured to output the first level signal is grounded.

Optionally, the first TFT 101 may be an n-type TFT, and the second TFT 102 may be a p-type TFT. To be specific, the second TFT 102 is turned on by a low level signal and is cut off by a high level signal. In this case, the target level signal may be a low level signal, and the first level signal is a high level signal. That is, the level of the target level signal is a low level relative to the level of the first level signal. Exemplarily, the signal port configured to output the target level signal is grounded.

This embodiment of the present disclosure uses only an example in which the first TFT 101 and the second TFT 102 are both n-type TFTs to briefly describe below a principle according to which the phase inverter in this embodiment of the present disclosure shifts a phase of an input signal by 180 degrees for output. A case in which the first TFT 101 is an n-type TFT and the second TFT 102 is a p-type TFT is similar to the case in which the first TFT 101 and the second TFT 102 are both n-type TFTs. Details are not described herein again in this embodiment of the present disclosure.

When a low level signal is input to the input terminal r of the phase inverter, the first TFT 101 is in an off state. In this case, the target level signal output by the signal port D connected to the second electrode J22 of the second TFT 102 is only used to drive the first electrode J21 and the second electrode J22 of the second TFT 102 to generate a current. The target level signal output from the signal port D passes through the first electrode J21 and the second electrode J22 of the second TFT 102 and is output from the output terminal c of the phase inverter. In this case, the signal output from the output terminal c of the phase inverter is a high level signal. In this way, the phase inverter provided in this embodiment of the present disclosure implements a function of shifting a low level signal by 180 degrees for output.

When a high level signal is input to the input terminal r of the phase inverter, the first TFT 101 is in an on state. In this case, the target level signal output by the signal port D connected to the second electrode J22 of the second TFT 102 not only is used to drive the first electrode J21 and the second electrode J22 of the second TFT 102 to generate a current but also is used to drive the first electrode J11 and the second electrode J12 of the first TFT 101 to generate a current. In this case, the target level signal output from the signal port D is voltage-divided by the first TFT 101 and the second TFT 102 that are connected in series. In this case, the signal output from the output terminal c of the phase inverter is a low level signal. In this way, the phase inverter provided in this embodiment of the present disclosure implements a function of shifting a high level signal by 180 degrees for output.

Continuing to refer to FIG. 1, as shown in FIG. 1, in the ring oscillator 100, an input terminal rk of a kth level of phase inverter f is connected to an output terminal ck−1 of a (k−1)th level of phase inverter f, an output terminal ck of the kth level of phase inverter f is connected to an input terminal rk+1 of a (k+1)th level of phase inverter f, and an output terminal cn of an nth level of phase inverter f is connected to an input terminal r1 of a first level of phase inverter f, where k is a positive integer greater than 1 and less than n.

The ring oscillator 100 can generate an oscillating wave. This embodiment of the present disclosure uses an example in which the ring oscillator 100 includes three levels of phase inverters f to brief describe below a principle according to which the ring oscillator 100 generates an oscillating wave.

At a moment t0, a high level signal is input to an input terminal of a first level of phase inverter. At a moment t1, the first level of phase inverter may output a low level signal, and the low level signal is input to an input terminal of a second level of phase inverter. At a moment t2, the second level of phase inverter may output a high level signal, and the high level signal is input to an input terminal of a third level of phase inverter. At a moment t3, the third level of phase inverter may output a low level signal, and the low level signal is input to the input terminal of the first level of phase inverter. In this way, after duration of t3-t0, a high level signal is changed into a low level signal at the input terminal of the first level of phase inverter. Similarly, after the same duration, the low level signal may be changed into the high level signal again at the input terminal of the first level of phase inverter. In this way, the ring oscillator 100 can generate an oscillating wave. A period of the oscillating wave generated by the ring oscillator 100 is t3-t0. It should be noted that the ring oscillator 100 can generate an oscillating wave only when the quantity of phase inverters included in the ring oscillator 100 is an odd number.

Generally, oscillating frequency of the ring oscillator is positively correlated to magnitude of a current passing through the phase inverters forming the ring oscillator. To be specific, when a larger current passes through the phase inverters forming the ring oscillator, the oscillating frequency of the ring oscillator is larger. The oscillating frequency of the ring oscillator means frequency of an oscillating wave generated by the ring oscillator. The reason is that when a larger current passes through the phase inverters, delays between input signals and output signals of the phase inverters are smaller. To be specific, in the foregoing example, values of t1-t0, t2-t1, and t3-t2 are smaller. When the delays between the input signals and the output signals of the phase inverters are smaller, an oscillating period of the ring oscillator consisting of the phase inverters is shorter. To be specific, the value of t3-t0 in the foregoing example is smaller. When the oscillating period of the ring oscillator is shorter, the oscillating frequency of the ring oscillator is larger.

Figure 3:
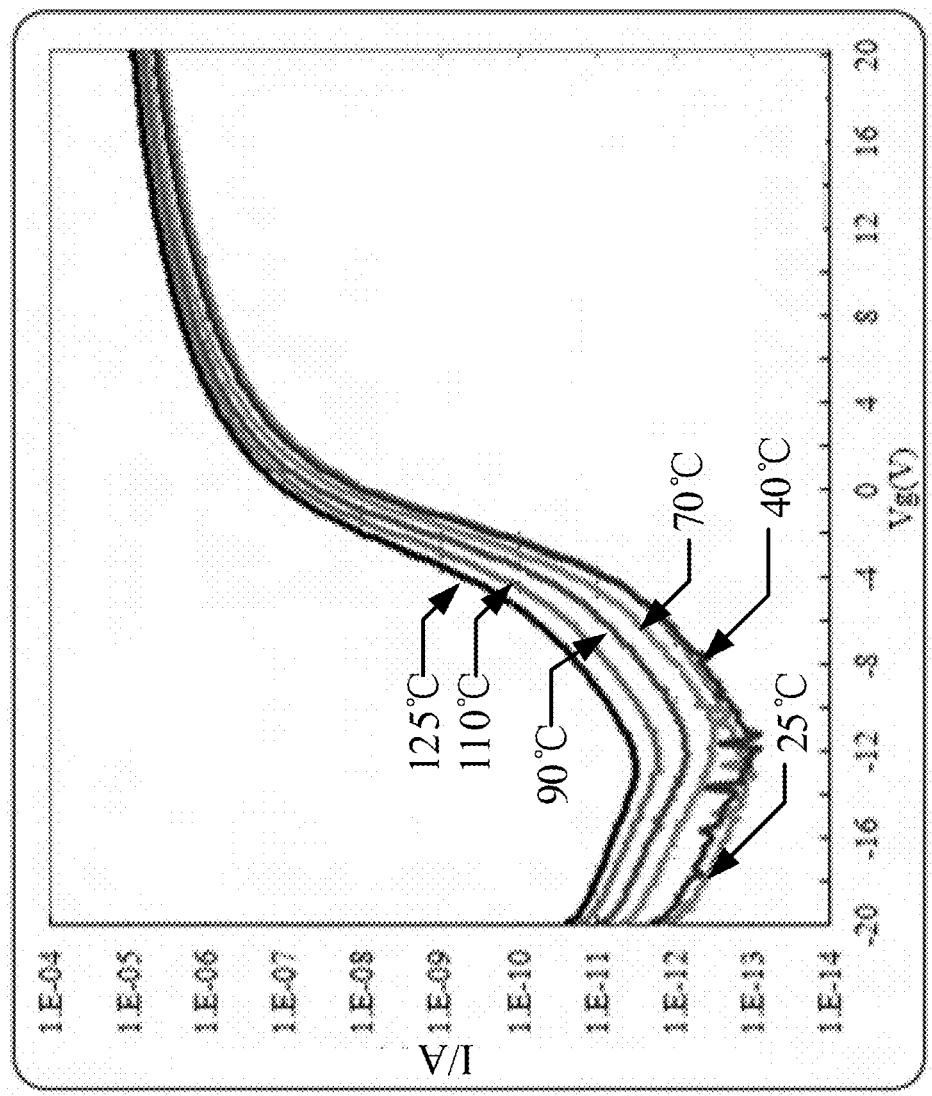
FIG. 3 is a schematic diagram of a characteristic curve of a TFT according to an embodiment of the present disclosure.

In addition, as temperature rises, a current value of a TFT changes. FIG. 3 shows a characteristic curve of a TFT. In FIG. 3, a vertical axis represents a current value between a first electrode and a second electrode of the TFT, where the unit is ampere, and a horizontal axis represents a voltage value between the first electrode and the second electrode of the TFT, where the unit is volt. As can be learned from FIG. 3, as temperature of the TFT rises, if the voltage value at the first electrode is the same as the voltage value at the second electrode of the TFT, the current value between the first electrode and the second electrode of the TFT increases.

As can be learned from the foregoing description, because the phase inverter f in this embodiment of the present disclosure consists of a TFT, when the temperature rises, a current value of the phase inverter f increases, and oscillating frequency of the ring oscillator 100 consisting of the phase inverters f also increases. Therefore, a temperature value measured by the temperature sensor provided in this embodiment of the present disclosure may be reflected by the oscillating frequency of the ring oscillator 100.

The temperature sensor provided in this embodiment of the present disclosure consists of a TFT, and a display panel usually includes a TFT. Therefore, the temperature sensor provided in this embodiment of the present disclosure may be integrated in the display panel, so that the temperature sensor can measure a temperature value of the display panel more accurately.

Optionally, to enable the ring oscillator 100 to generate oscillation, a gain value of the ring oscillator needs to be greater than a gain threshold. Optionally, the gain threshold may be 1. To be specific, the gain value of the ring oscillator needs to be greater than 1, and a gain of the ring oscillator may be represented by using the following formula:

$$A_V = \sqrt{\frac{\mu_1 C_{ox1}\left(\frac{W_1}{L_1}\right)}{\mu_2 C_{ox2}\left(\frac{W_2}{L_2}\right)}},$$

where $A_v$ is a gain between the first TFT 101 and the second TFT 102, $\mu_1$ is mobility of an active layer material of the first TFT 101, $C_{ox1}$ is a capacitance of a gate insulating layer of the first TFT 101, $$\frac{W_1}{L_1}$$

is a width/length ratio of a channel of the first TFT 101, $\mu_2$ is mobility of an active layer material of the second TFT 102, $C_{ox2}$ is a capacitance of a gate insulating layer of the second TFT 102, and $$\frac{W_2}{L_2}$$

is a width/length ratio of a channel of the second TFT 102.

A capacitance of a gate insulating layer means is a capacitance between electrodes at two ends of the gate insulating layer.

As can be learned from the foregoing formula, it may be ensured that the ring oscillator 100 generates an oscillating wave by ensuring that a ratio of the width/length ratio of the channel of the first TFT 101 to the width/length ratio of the channel of the second TFT 102 is greater than a threshold. Optionally, the threshold may be 20. Alternatively, it may be ensured that the ring oscillator 100 generates an oscillating wave by ensuring that a ratio of the mobility of the active layer material of the first TFT 101 to the mobility of the active layer material of the second TFT 102 is greater than a threshold. Further alternatively, it may be ensured that the ring oscillator 100 generates an oscillating wave by ensuring that a ratio of the capacitance of the gate insulating layer of the first TFT 101 to the capacitance of the gate insulating layer of the second TFT 102 is greater than a threshold.

However, generally, capacitances of gate insulating layers of different types of TFTs are generally 10 farads to 8 farads and the differences are relatively small. Therefore, it is difficult to ensure that the ring oscillator 100 generates an oscillating wave by ensuring that the ratio of the capacitance of the gate insulating layer of the first TFT 101 to the capacitance of the gate insulating layer of the second TFT 102 is greater than a threshold. When it is ensured that the ratio of the width/length ratio of the channel of the first TFT 101 to the width/length ratio of the channel of the second TFT 102 is greater than a threshold, the width/length ratio of the channel of the first TFT 101 is relatively large. When the width/length ratio of the channel of the first TFT 101 is relatively large, the first TFT 101 consequently occupies a relatively large area. As a result, it is more difficult to integrate the temperature sensor in the display panel, and the first TFT 101 further has a relatively large parasitic capacitance, leading to relatively high power consumption of the first TFT.

Therefore, in this embodiment of the present disclosure, it may be ensured that the ring oscillator 100 generates an oscillating wave by ensuring that the ratio of the mobility of the active layer material of the first TFT 101 to the mobility of the active layer material of the second TFT 102 is greater than a threshold. For example, the threshold is greater than 1. To be specific, it may be ensured that the ring oscillator 100 generates an oscillating wave by ensuring that the mobility of the active layer material of the first TFT 101 is greater than the mobility of the active layer material of the second TFT 102.

In conclusion, this embodiment of the present disclosure provides the temperature sensor that includes n levels of phase inverters, where each level of phase inverter includes the first TFT and the second TFT. In this way, the temperature sensor may consist of a TFT in the display panel, so that the temperature sensor may be integrated in the display panel, and further the temperature sensor can accurately monitor temperature inside the display panel, thereby improving the measurement accuracy of the temperature sensor.

Optionally, TFTs usually include a low temperature polysilicon (LTPS) TFT, an amorphous silicon (α-Si) TFT, and an oxide semiconductor TFT. Mobility of an active layer material of the LTPS TFT is usually between 80 and 120, and mobility of an active layer material of a relatively common LTPS TFT is 100. Mobility of an active layer material of the α-Si TFT is usually less than 1, and mobility of an active layer material of a relatively common α-Si TFT is 0.1. Mobility of an active layer material of the oxide semiconductor TFT is usually between 1 and 30, and mobility of an active layer material of a relatively common oxide semiconductor TFT is 10.

To ensure that the mobility of the active layer material of the first TFT 101 is greater than the mobility of the active layer material of the second TFT 102, in this embodiment of the present disclosure, the first TFT 101 may be an LTPS TFT, and the second TFT 102 may be an α-Si TFT, or, the first TFT 101 may be an oxide semiconductor TFT, and the second TFT 102 may be an α-Si TFT, or, the first TFT 101 is an LTPS TFT, and the second TFT 102 is an oxide semiconductor TFT.

Optionally, in this embodiment of the present disclosure, the first TFT 101 may be a bottom gate structure, a top gate structure or a double gate structure. Similarly, the second TFT 102 may be a bottom gate structure, a top gate structure or a double gate structure.

Figure 4:
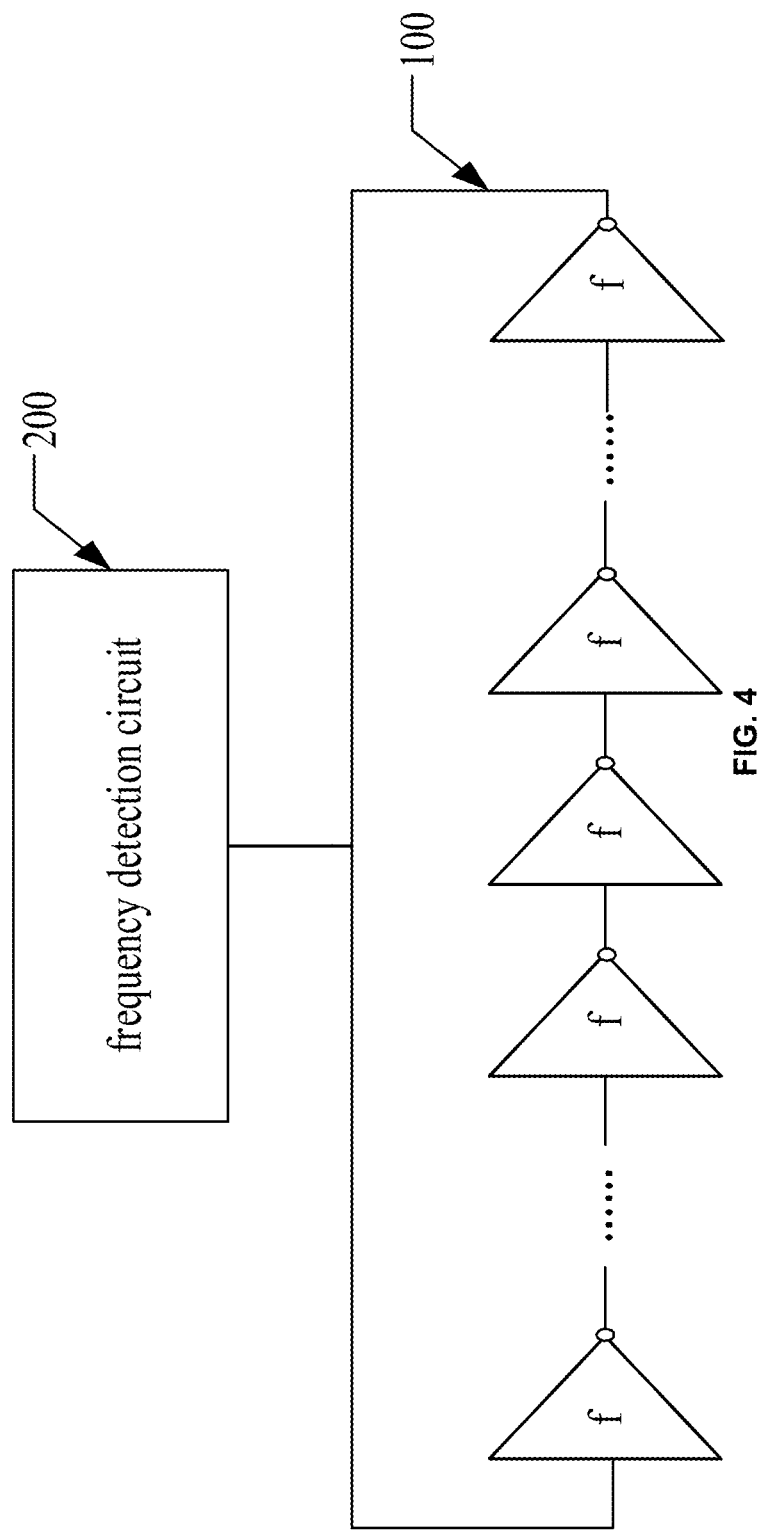
FIG. 4 is a schematic structural diagram of a temperature sensor according to an embodiment of the present disclosure.

Optionally, as shown in FIG. 4, in this embodiment of the present disclosure, the temperature sensor may further include a frequency detection circuit 200. The frequency detection circuit 200 is connected to the ring oscillator 100. The frequency detection circuit 200 is configured to detect frequency of an oscillating wave generated by the ring oscillator 100, to determine, by using the frequency of the oscillating wave, the temperature value measured by the temperature sensor.

In conclusion, this embodiment of the present disclosure provides the temperature sensor that includes n levels of phase inverters, where each level of phase inverter includes the first TFT and the second TFT. In this way, the temperature sensor may consist of a TFT in the display panel, so that the temperature sensor may be integrated in the display panel, and further the temperature sensor can accurately monitor temperature inside the display panel, thereby improving the measurement accuracy of the temperature sensor.

Figure 5:
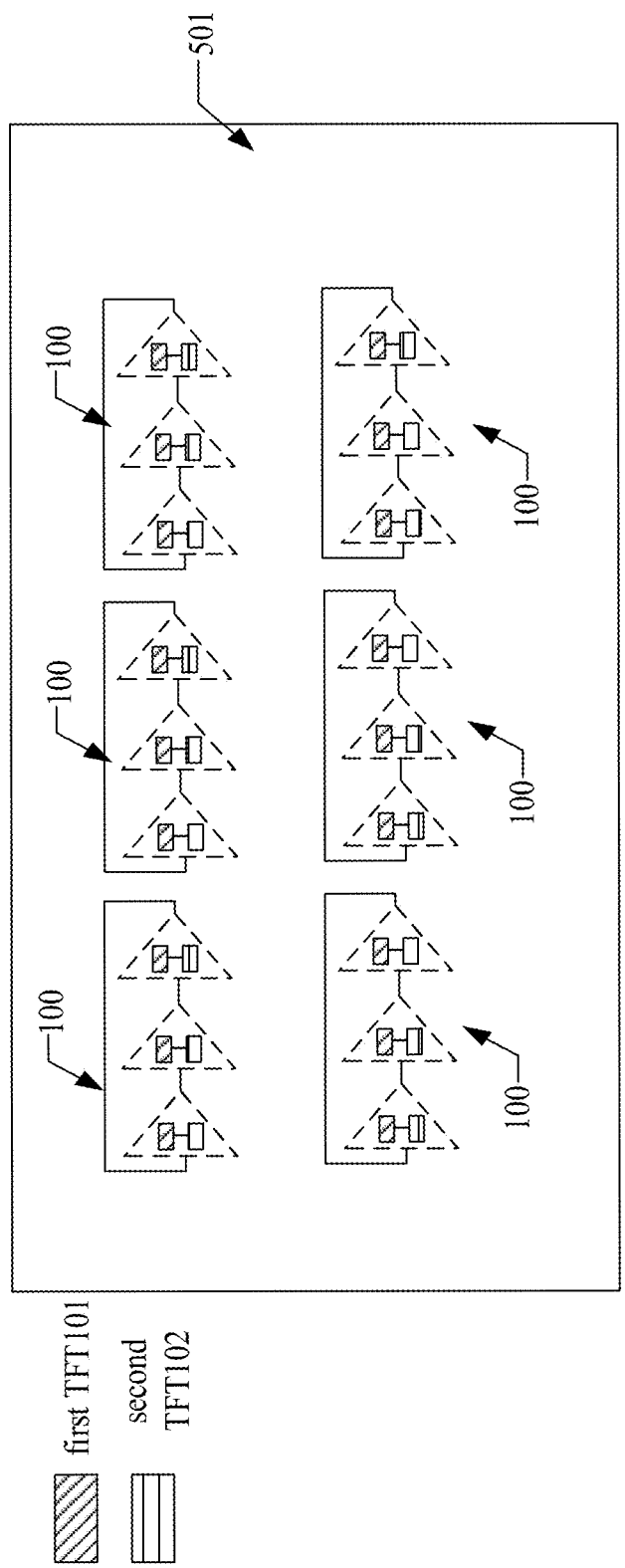
FIG. 5 is a schematic diagram of a display panel according to an embodiment of the present disclosure.

An embodiment of the present disclosure further provides a display panel. As shown in FIG. 5, the display panel includes a substrate 501 and a plurality of TFTs disposed on the substrate. The plurality of TFTs includes the foregoing TFTs in the ring oscillator 100 in the temperature sensor. To be specific, the plurality of TFTs includes the foregoing first TFT 101 and second TFT 102. To be specific, the foregoing temperature sensor is integrated in the display panel. It should be noted that FIG. 5 only shows the first TFT 101 and the second TFT 102 of the plurality of TFTs disposed on the substrate, and FIG. 5 only shows some first TFTs 101 and second TFTs 102.

Optionally, the first TFT 101 and the second TFT 102 are disposed adjacently on the substrate. Optionally, the first TFT 101 and the second TFT 102 are disposed adjacently on the substrate in a target direction. For example, the first TFT 101 and the second TFT 102 may be located in a same row and are adjacent in the same row. Alternatively, the first TFT 101 and the second TFT 102 may be located in a same column and are adjacent in the same column. As shown in FIG. 5, the first TFT 101 and the second TFT 102 of each phase inverter in the ring oscillator 100 are located in a same column and are adjacent in the same column.

In addition, the foregoing kth level of phase inverter, (k−1)th level of phase inverter, and (k+1)th level of phase inverter are also disposed adjacently on the substrate.

The first TFT 101 and the second TFT 102 are disposed adjacently, and the kth level of phase inverter, the (k−1)th level of phase inverter, and the (k+1)th level of phase inverter are disposed adjacently, so that the difficulty of manufacturing the temperature sensor can be reduced.

Optionally, the first TFT 101 and the second TFT 102 may be disposed in a non-display region of the display panel, to avoid negative impact on display of the display panel.

An embodiment of the present disclosure further provides a display apparatus. The display apparatus includes the foregoing display panel. The display apparatus may be any product or component having a display function, for example, an electronic paper, a mobile phone, a tablet computer, a television, a display, a notebook computer, a digital photo frame, and a navigator.

The foregoing descriptions are merely preferred embodiments of the present disclosure, but are not intended to limit the present disclosure. Any modification, equivalent replacement, or improvement made within the spirit and principle of the present disclosure shall fall within the protection scope of the present disclosure.

What is claimed is:

1. A temperature sensor, comprising a ring oscillator consisting of n levels of phase inverters, wherein n is an odd number, wherein
   each level of phase inverter comprises a first thin film transistor (TFT) and a second TFT that are connected in series, an on/off state of the first TFT is configured to be determined by a signal input to the phase inverter, an on/off state of the second TFT is configured to be in a normally on state, and mobility of an active layer material of the first TFT is greater than mobility of an active layer material of the second TFT.

2. The temperature sensor according to claim 1, wherein a combination of a type of the first TFT and a type of the second TFT is any of the followings:
   the first TFT is a low temperature poly-silicon TFT, and the second TFT is an amorphous silicon TFT;
   the first TFT is an oxide semiconductor TFT, and the second TFT is an amorphous silicon TFT; and
   the first TFT is a low temperature poly-silicon TFT, and the second TFT is an oxide semiconductor TFT.

3. The temperature sensor according to claim 1, wherein a gate of the first TFT is connected to an input terminal of the phase inverter, a first electrode of the first TFT is connected to a first electrode of the second TFT and an output terminal of the inverter respectively, and a second electrode of the first TFT is connected to a signal port configured to output a first level signal;
   a gate of the second TFT and a second electrode of the second TFT are connected to a signal port configured to output a target level signal respectively;
   wherein the target level signal is a level signal that can turn on the second TFT, each of a level of the target level signal and a level of the first level signal is one of a first level and a second level, respectively, and the first level is a high level relative to the second level; and
   each of the first electrode and the second electrode are one of a source and a drain, respectively.

4. The temperature sensor according to claim 3, wherein the first TFT and the second TFT are both n-type TFTs.

5. The temperature sensor according to claim 3, wherein the first TFT is an n-type TFT, and the second TFT is a p-type TFT.

6. The temperature sensor according to claim 1, wherein the first TFT has one of a bottom gate structure, a top gate structure and a double gate structure; and
   the second TFT has one of a bottom gate structure, a top gate structure and a double gate structure.

7. The temperature sensor according to claim 1, wherein a gain value of the ring oscillator is greater than 1, and the gain value is:

$$A_V = \sqrt{\frac{\mu_1 C_{ox1}\left(\frac{W_1}{L_1}\right)}{\mu_2 C_{ox2}\left(\frac{W_2}{L_2}\right)}},$$

wherein $A_v$ is a gain between the first TFT and the second TFT, $\mu_1$ is the mobility of the active layer material of the first TFT, $C_{ox1}$ is a capacitance of a gate insulating layer of the first TFT, $$\frac{W_1}{L_1}$$

is a width/length ratio of a channel of the first TFT, $\mu_2$ is the mobility of the active layer material of the second TFT, $C_{ox2}$ is a capacitance of a gate insulating layer of the second TFT, and $$\frac{W_2}{L_2}$$

is a width/length ratio of a channel of the second TFT.

8. The temperature sensor according to claim 1, wherein the temperature sensor further comprises a frequency detection circuit connected to the ring oscillator; and
the frequency detection circuit is configured to detect frequency of an oscillating wave generated by the ring oscillator.

9. A display panel, wherein a temperature sensor is disposed in the display panel, the temperature sensor comprises a ring oscillator consisting of n levels of phase inverters, wherein n is an odd number,
each level of phase inverter comprises a first TFT and a second TFT that are connected in series, an on/off state of the first TFT is configured to be determined by a signal input to the phase inverter, an on/off state of the second TFT is configured to be in a normally on state, and mobility of an active layer material of the first TFT is greater than mobility of an active layer material of the second TFT.

10. The display panel according to claim 9, wherein the display panel comprises a substrate and a plurality of thin film transistors (TFT) disposed on the substrate, and the plurality of TFTs comprises the first TFT and the second TFT.

11. The display panel according to claim 10, wherein the first TFT and the second TFT are disposed adjacently on the substrate.

12. The display panel according to claim 10, wherein the n levels of phase inverters are disposed adjacently on the substrate.

13. The display panel according to claim 10, wherein the first TFT and the second TFT are disposed in a non-display region of the display panel.

14. A display apparatus, comprising: a display panel, wherein a temperature sensor is disposed in the display panel,
the temperature sensor comprises a ring oscillator consisting of n levels of phase inverters, wherein n is an odd number,
each level of phase inverter comprises a first TFT and a second TFT that are connected in series, an on/off state of the first TFT is configured to be determined by a signal input to the phase inverter, an on/off state of the second TFT is configured to be in a normally on state, and mobility of an active layer material of the first TFT is greater than mobility of an active layer material of the second TFT.

15. The temperature sensor according to claim 8, wherein a gate of the first TFT is connected to an input terminal of the inverter, a first electrode of the first TFT is connected to a first electrode of the second TFT and an output terminal of the inverter respectively, and a second electrode of the first TFT is connected to a signal port configured to output a first level signal;
a first electrode of the second TFT is further connected to the output terminal of the inverter, and a gate of the second TFT and a second electrode of the second TFT are connected to a signal port configured to output a target level signal respectively;
wherein the target level signal is a level signal that can turn on the second TFT, each of a level of the target level signal and a level of the first level signal is one of a first level and a second level, respectively, and the first level is a high level relative to the second level; and each of the first electrode and the second electrode are one of a source and a drain, respectively;
a combination of a type of the first TFT and a type of the second TFT is any of the followings: the first TFT is a low temperature poly-silicon TFT, and the second TFT is an amorphous silicon TFT; the first TFT is an oxide semiconductor TFT, and the second TFT is an amorphous silicon TFT; the first TFT is a low temperature poly-silicon TFT, and the second TFT is an oxide semiconductor TFT;
the first TFT has one of a bottom gate structure, a top gate structure and a double gate structure; and the second TFT has one of a bottom gate structure, a top gate structure and a double gate structure; and
a combination of the first TFT and the second TFT is any of the followings: the first TFT and the second TFT are both n-type TFTs; and the first TFT is an n-type TFT, and the second TFT is a p-type TFT.

16. The display panel according to claim 9, wherein a combination of a type of the first TFT and a type of the second TFT is any of the followings:
the first TFT is a low temperature poly-silicon TFT, and the second TFT is an amorphous silicon TFT;
the first TFT is an oxide semiconductor TFT, and the second TFT is an amorphous silicon TFT; and
the first TFT is a low temperature poly-silicon TFT, and the second TFT is an oxide semiconductor TFT.

17. The display panel according to claim 9, wherein a gate of the first TFT is connected to an input terminal of the inverter, a first electrode of the first TFT is connected to a first electrode of the second TFT and an output terminal of the inverter respectively, and a second electrode of the first TFT is connected to a signal port configured to output a first level signal;
a first electrode of the second TFT is further connected to the output terminal of the inverter, and a gate of the second TFT and a second electrode of the second TFT are connected to a signal port configured to output a target level signal respectively;
wherein the target level signal is a level signal that can turn on the second TFT, each of a level of the target level signal and a level of the first level signal is one of a first level and a second level, respectively, and the first level is a high level relative to the second level; and each of the first electrode and the second electrode are one of a source and a drain, respectively.

18. The display panel according to claim 9, wherein the first TFT and the second TFT are both n-type TFTs.

19. The display panel according to claim 9, wherein the first TFT is an n-type TFT, and the second TFT is a p-type TFT.

20. The display panel according to claim 9, wherein the first TFT has one of a bottom gate structure, a top gate structure and a double gate structure; and the second TFT has one of a bottom gate structure, a top gate structure and a double gate structure.

\* \* \* \* \*